United States Patent
Schlaeffer et al.

(10) Patent No.: US 11,907,581 B2
(45) Date of Patent: Feb. 20, 2024

(54) DATA STORAGE DEVICE AND METHOD FOR WRITING INFORMATION INTO A DATA STORAGE DEVICE

(71) Applicant: Infineon Technologies AG, Neubiberg (DE)

(72) Inventors: Martin Schlaeffer, Munich (DE); Osama Amin, Munich (DE); Elif Bilge Kavun, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/689,285

(22) Filed: Mar. 8, 2022

(65) Prior Publication Data

US 2022/0291870 A1  Sep. 15, 2022

(30) Foreign Application Priority Data

Mar. 11, 2021 (DE) .......................... 102021202376.2

(51) Int. Cl.
*G06F 3/06* (2006.01)
(52) U.S. Cl.
CPC ............ *G06F 3/0659* (2013.01); *G06F 3/061* (2013.01); *G06F 3/0673* (2013.01)
(58) Field of Classification Search
CPC ....... G06F 3/0659; G06F 3/061; G06F 3/0673
See application file for complete search history.

(56) References Cited

U.S. PATENT DOCUMENTS

| | | | |
|---|---|---|---|
| 5,959,911 A | 9/1999 | Krause et al. | |
| 2001/0043507 A1 | 11/2001 | Ooishi | |
| 2004/0205072 A1* | 10/2004 | Richmond | H04L 41/12 |
| 2014/0082282 A1* | 3/2014 | Wang | G06F 3/064 711/114 |
| 2019/0043553 A1* | 2/2019 | Chang | G06F 3/0673 |
| 2019/0392297 A1* | 12/2019 | Lau | G06F 17/16 |
| 2020/0097289 A1* | 3/2020 | Eapen | G06F 9/30018 |

* cited by examiner

*Primary Examiner* — Nanci N Wong
(74) *Attorney, Agent, or Firm* — COOPER LEGAL GROUP, LLC (57) ABSTRACT

A data storage device comprises a plurality of storage elements, each storage element configured for storing a piece of information. The plurality of storage elements is accessible as a plurality of word sets, each word set comprising a set of storage elements, and is accessible as a plurality of slice sets, each slice set comprising a set of storage elements. Each storage element is a part of a word set and a part of a slice set. The device further comprises a control unit configured for obtaining word information and slice information and for executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements.

32 Claims, 6 Drawing Sheets

DATA STORAGE DEVICE AND METHOD FOR WRITING INFORMATION INTO A DATA STORAGE DEVICE

RELATED APPLICATION

This application claims priority to German Patent Application No. 102021202376.2, filed on Mar. 11, 2021, entitled "Data Storage Device and Method for Writing Information into a Data Storage Device", which is incorporated by reference herein in its entirety.

SUMMARY

The present disclosure is related to a data storage device and to a method for writing information into a data storage device. The present disclosure is further related to a memory with simultaneous orthogonal read and write access.

A data storage may comprise several storage elements that may store information. Some data storage devices may be accessed by a write operation so as to write or store information into one or more storage elements. Some data storage devices may be accessed with a read operation to obtain or read information stored in storage elements.

There is a need for efficiently performing secure write operations in data storage devices.

According to an embodiment, a data storage device comprises a plurality of storage elements, each storage element of the plurality of storage elements configured for storage a piece of information. The plurality of storage elements is accessible as a plurality of word sets and as a plurality of slice sets. Each word set of the plurality of word sets comprise a set of storage elements (of the plurality of storage elements, for example). Each slice set of the plurality of slice sets comprises a set of storage elements (of the plurality of storage elements, for example). Each storage element of the plurality of storage elements is a part of a word set of the plurality of word sets and a part of a slice set of the plurality of slice sets. The data storage device comprises a control unit configured for obtaining word information and slice information. The control unit is configured for executing a write operation to parallelly write the word information into a first word set of the plurality of word sets and the slice information into a first slice set of the plurality of slice sets (e.g., the word information and the slice information are parallelly written). The first word set and the first slice set comprise a common storage element defined by an overlap of the first word set and the first slice set in a layout of the plurality of storage elements.

According to an embodiment, a method for writing information into a data storage device comprising a plurality of storage elements is provided. Each storage element of the plurality of storage elements is configured for storing a piece of information. The plurality of storage elements are accessible as a plurality of word sets and a plurality of slice sets. Each word set of the plurality of word sets comprises a set of storage elements (of the plurality of storage elements, for example). Each slice set of the plurality of slice sets comprises a set of storage elements (of the plurality of storage elements, for example). Each storage element of the plurality of storage elements is a part of a word set of the plurality of word sets and a part of a slice set of the plurality of slice sets. The method comprises obtaining word information and slice information. The method comprises executing a write operation to parallelly write the word information into a first word set of the plurality of word sets and the slice information into a first slice set of the plurality of slice sets. The first word set and the first slice set comprise a common storage element defined by an overlap of the first word set and the first slice set in a layout of the plurality of storage elements (e.g., the write operation may be performed such that the first word set and the first slice set comprise the common storage element).

According to an embodiment, a non-transitory storage medium is provided. A computer program, stored on the non-transitory storage medium, has a program code for performing, when running on a computer, the method.

Further embodiments are defined in the dependent claims.

DESCRIPTION OF THE DRAWINGS

Embodiments in accordance with the present disclosure are described in the following making reference to the accompanying drawings in which.

DETAILED DESCRIPTION

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present disclosure. However, it will be apparent to those skilled in the art that embodiments of the present disclosure may be practiced without these specific details. In other instances, well known structures and devices are shown in block diagram form rather than in detail in order to avoid obscuring embodiments of the present disclosure. In addition, features of the different embodiments described hereinafter may be combined with each other, unless specifically noted otherwise.

Embodiments of the present disclosure relate to storage elements. Storage elements may be adapted for storing a piece of information. For example, such a piece of information may comprise one or more bits. For example, a storage element may comprise a resistive random access memory (RRAM) memory cell, a magneto resistive RAM (MRAM) memory cell or any other type of volatile or non-volatile memory cell.

A data storage device in accordance with embodiments may comprise a plurality of storage elements, for example at least 5, at least 10, at least 100, at least 1000 or even more, e.g., several thousand, several million or even several billion of memory cells. Each memory cell may be adapted to store a piece of information, e.g., one or a higher number of bits.

Figure 1:
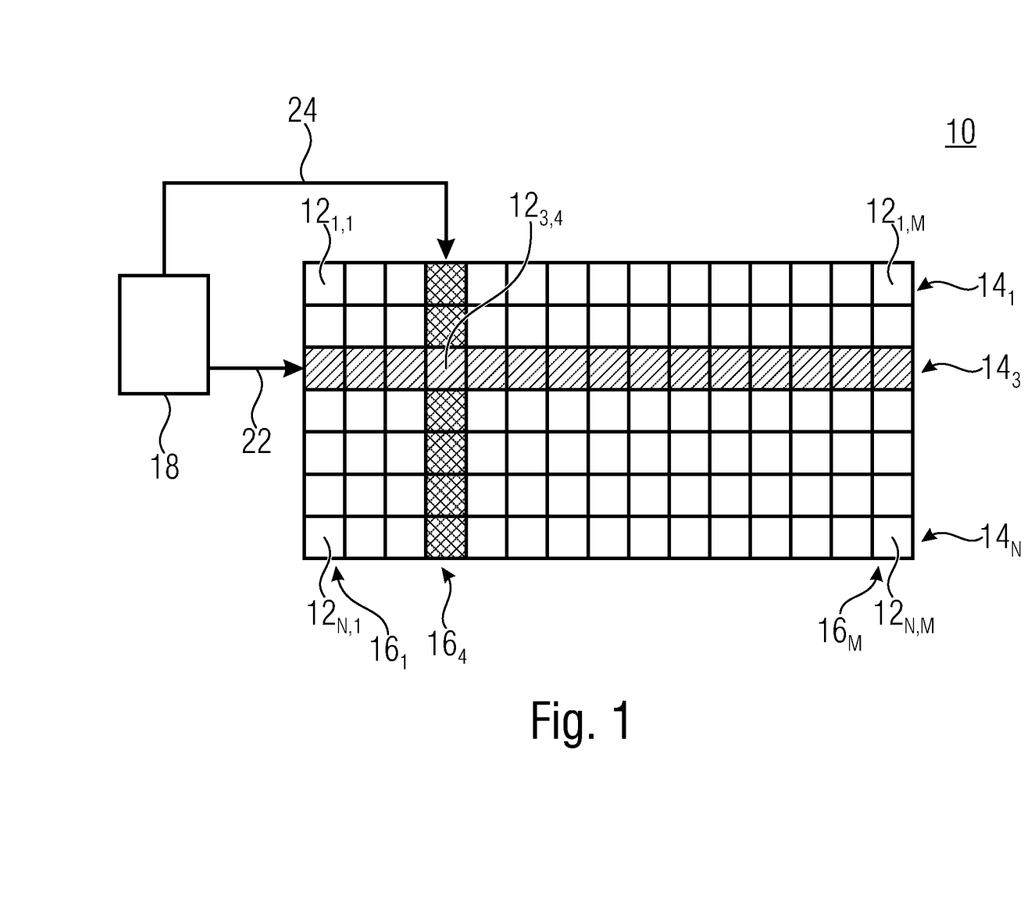
FIG. 1 shows a schematic block diagram of a data storage device according to an embodiment.

FIG. 1 shows a schematic block diagram of a data storage device 10 according to an embodiment. Data storage device 10 may comprise a plurality of storage elements 12 which may be addressable for a read and/or write operation as a plurality of word sets $14_1$ to $14_N$ and a plurality of slice sets $16_1$ to $16_M$ of data storage elements.

The plurality of storage elements (e.g., data storage elements) $12_{1,1}$ to $12_{N,M}$ may be arranged in a corresponding matrix configuration. Alternatively or in addition, the plurality of storage elements $12_{1,1}$ to $12_{N,M}$ may be arranged differently from the corresponding matrix configuration. In some embodiments (e.g., an embodiment in which the plurality of storage elements $12_{1,1}$ to $12_{N,M}$ are arranged in the corresponding matrix configuration and/or an embodiment in which the plurality of storage elements $12_{1,1}$ to $12_{N,M}$ are arranged differently from the corresponding matrix configuration), the plurality of storage elements $12_{1,1}$ to $12_{N,M}$ may be connected to each other according to a matrix configuration in which the plurality of word sets $14_1$ to $14_N$ is arranged parallel to each other along a first direction and in which the plurality of slice sets $16_1$ to $16_M$ is arranged parallel to each other along a second direction perpendicular to the first direction. Sets of data storage elements along a direction (e.g., a specific direction, such as the first direction or the second direction) may be accessed together to read and/or write a combined information therein, e.g., a data word or a data slice. According to an embodiment, the control unit 18 may be configured for writing a word information 22 along the first direction, e.g., along a word set, and a slice information 24 along the second direction, e.g., along a slice set, into the plurality of storage elements according to the matrix configuration of the plurality of data storage elements.

A number of storage elements 12 in a word set 14 may be smaller, equal or larger when compared to a number of storage elements forming a slice set 16. That is, a control unit of a data storage device in accordance with embodiments may obtain the word information 22 having a first data length and the slice information having a second data length different than the first data length. Different word sets may comprise a same number of data storage elements 12. Correspondingly, different slice sets may comprise a same number of data storage elements 12. Alternatively or in addition, different word sets may comprise different numbers of data storage elements 12, and/or different slice sets may comprise different numbers of data storage elements 12.

When performing, for example, a write operation to add or replace information in the data storage device 10, a control unit 18 of the data storage device 10 may generate information for a word set and for a slice set to be both written into the plurality of storage elements (e.g., the information may comprise information to be written into storage elements of a word set 14 and information to be written into storage elements of a slice set 16). However, such a write operation is not limited to write only one word set 14 and only one slice set 16. During a write operation, a higher number of word sets, e.g., at least 2, at least 3 or at least 4 or even a higher number may be written together with at least 1, at least 2, at last 3 or at least 4 or even a higher number of slice sets. Alternatively or in addition, a number of more than one slice sets may be written together with at least one word set. In some embodiments, a number of word sets and a number of slice sets to be written during a single write operation is equal and comprises a value of at least 1. For example, the control unit 18 may configured for parallelly writing a plurality of word information into a corresponding plurality of word sets and a plurality of slice information, associated with the plurality of word information, into a corresponding plurality of slice sets. Each word set of the corresponding plurality of word sets may comprise a common storage element with a slice set of the corresponding plurality of slice sets (e.g., the word set and the slice set comprise the common storage element). The control unit may be configured for solving a corresponding plurality of competing pieces of information at positions corresponding to common storage elements of the corresponding plurality of slice sets and the corresponding plurality of word sets. For example, solving the corresponding plurality of competing pieces of information may comprise solving a competing piece of information at a position corresponding to a common storage element comprised in a word set of the corresponding plurality of word sets and a slice set of the corresponding plurality of slice sets.

In some examples, a word set $14_3$ is written in parallel with a slice set $16_4$, wherein the word set $14_3$ and the slice set $16_4$ have a common storage element $12_{3,4}$ defined by an overlap of the word set $14_3$ and the slice set $16_4$. Each of the storage elements being arranged in the plurality of word sets 14 and the plurality of slice sets 16 may be part of a word set and part of a slice set.

The control unit 18 may be configured for obtaining word information 22 and slice information 24, e.g., the word information 22 and/or the slice information 24 may comprise a sequence of information and/or bits. The word information 22 and/or the slice information 24 may be obtained from any source and is obtained, in one embodiment, based on a bit transformation.

The control unit 18 may execute a write operation to parallelly write the word information 22 into a word set, e.g., the word set $14_3$, and the slice information 24 into a slice set, e.g., the slice set $16_4$. To parallelly write the word information 22 and the slice information 24, storing the word information 22 into the word set $14_3$ and the slice information 24 into the slice set $16_4$ may be executed at least in parts during a same instance of time. That is, the control unit 18 may be configured for writing the word information 22 during a word-write time interval and for writing the slice information 24 during a slice-write time interval. The control unit 18 may be configured for writing the word information and the slice information such that the word-write time interval overlaps with the slice-write time interval partly or completely. The word-write time interval and the slice-write time interval may have a same length in time or different lengths in time. A point in time at which the word-write time interval starts or begins may be the same as or different than a point in time at which the slice-write time interval starts or begins. A point in time at which the word-write time interval ends may be the same as or different than a point in time at which the slice-write time interval ends.

Based on the parallel write operation, it may be seen that there may occur a conflict for the piece of information to be stored into the common storage element $12_{3,4}$ being defined by the overlap of the word set $14_3$ and the slice set $16_4$. Such a conflict may arise in a case when the piece of information to be stored for storing the word information 22 differs from the piece of information of the piece of information to be stored for storing the slice information 24 at the location associated with the common storage element $12_{3,4}$. The control unit 18 may implement one or more concepts described herein for solving such conflicts.

Such a conflict may relate to a competing piece of information between the word information 22 and the slice information 24 for the common storage element $12_{3,4}$. That is, the word information may comprise or indicate a first piece of information for the common storage element $12_{3,4}$, whilst the slice information 24 contains or indicates a deviating second piece of information for the same data storage element $12_{3,4}$. Solving the competing piece of information may comprise writing the data storage element $12_{3,4}$ once with the corresponding part of the word information 22 and at a different instance in time, i.e., prior or later, writing the data storage element $12_{3,4}$ with the corresponding part of the slice information 24.

This may be referred to as prioritizing the word information over the slice information or, alternatively, for prioritizing the slice information over the word information in at least the common storage element $12_{3,4}$. The prioritized information is written into the common storage element $12_{3,4}$ later when compared to the information over which it is prioritized.

According to an embodiment, the control unit 18 may be configured for writing a single data element to the common storage element $12_{3,4}$. This may be understood as a single write operation when writing the word information 22 together with the slice information 24. Thereby, either a part of the word information 22 or a part of the slice information 24 may be stored in the common storage element $12_{3,4}$.

According to an embodiment, for the write operation, the control unit 18 may be configured for substituting a part of the slice information 24 that corresponds to the common storage element $12_{3,4}$ with a corresponding part of the word information 22, wherein the corresponding part of the word information 22 corresponds to the common storage element $12_{3,4}$. Thereby, the slice information may possibly be falsified or become error prone which may be, however, corrected, e.g., when using error detecting codes and/or error correcting codes. Alternatively, the control unit 18 may also be configured for substituting a part of the word information 22 corresponding to the common storage element $12_{3,4}$ with a corresponding part of the slice information 24, wherein the corresponding part of the slice information 24 corresponds to the common storage element $12_{3,4}$. That is, the word information may be falsified or adapted (instead of falsifying the slice information, for example).

Figure 2A:
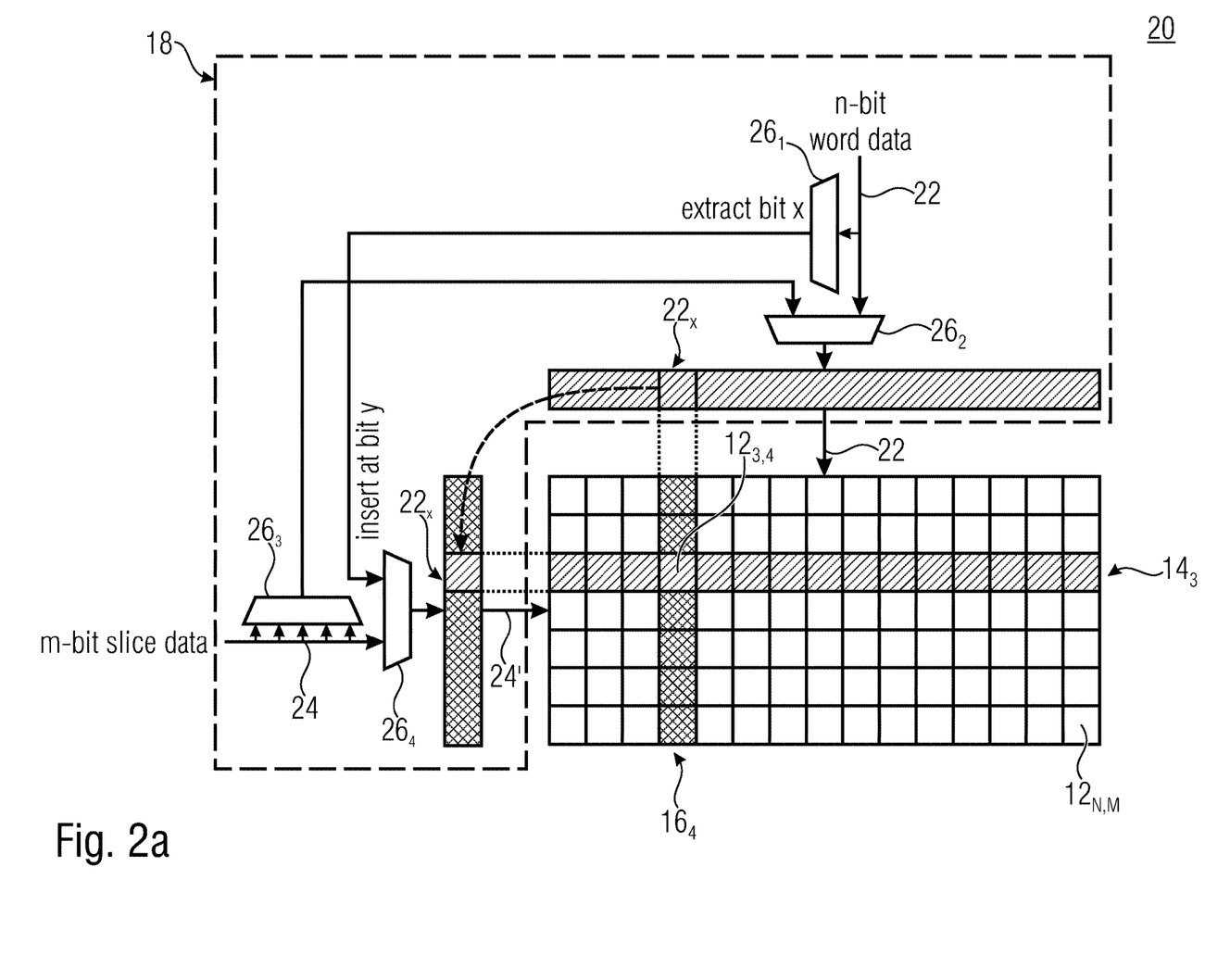
FIG. 2a shows a schematic block diagram of a data storage device according to an embodiment in which a word information is prioritized over a slice information to be parallelly written.

FIG. 2a shows a schematic block diagram of a data storage device 20 according to an embodiment. The data storage device 20 may comprise the same data storage elements 12 when compared to the data storage device 10. The control unit 18 may be configured for substituting a part of the slice information 24 with a piece of information $12_x$ so as to obtain modified slice information 24'. For example, by use of one or more circuit elements such as multiplexes 26, a bit x may be combined with the slice information 24 at any selected bit position, i.e., the position of the common data storage element $12_{3,4}$ in the slice information 24. Thereby, the word information 22 may be prioritized over the slice information 24.

In other words, FIG. 2a shows a memory with N words and M slices. At an overlapping bit at a position (x, y) a conflict may occur. This may be solved by transferring a single bit with priority and/or by using a gate bit with or without priority. In this example, the word information has priority and is a real information whilst the slice information is a dummy information (e.g., the word information may be prioritized over the slice information based on the word information being the real information and/or the slice information being the dummy information).

Figure 2B:
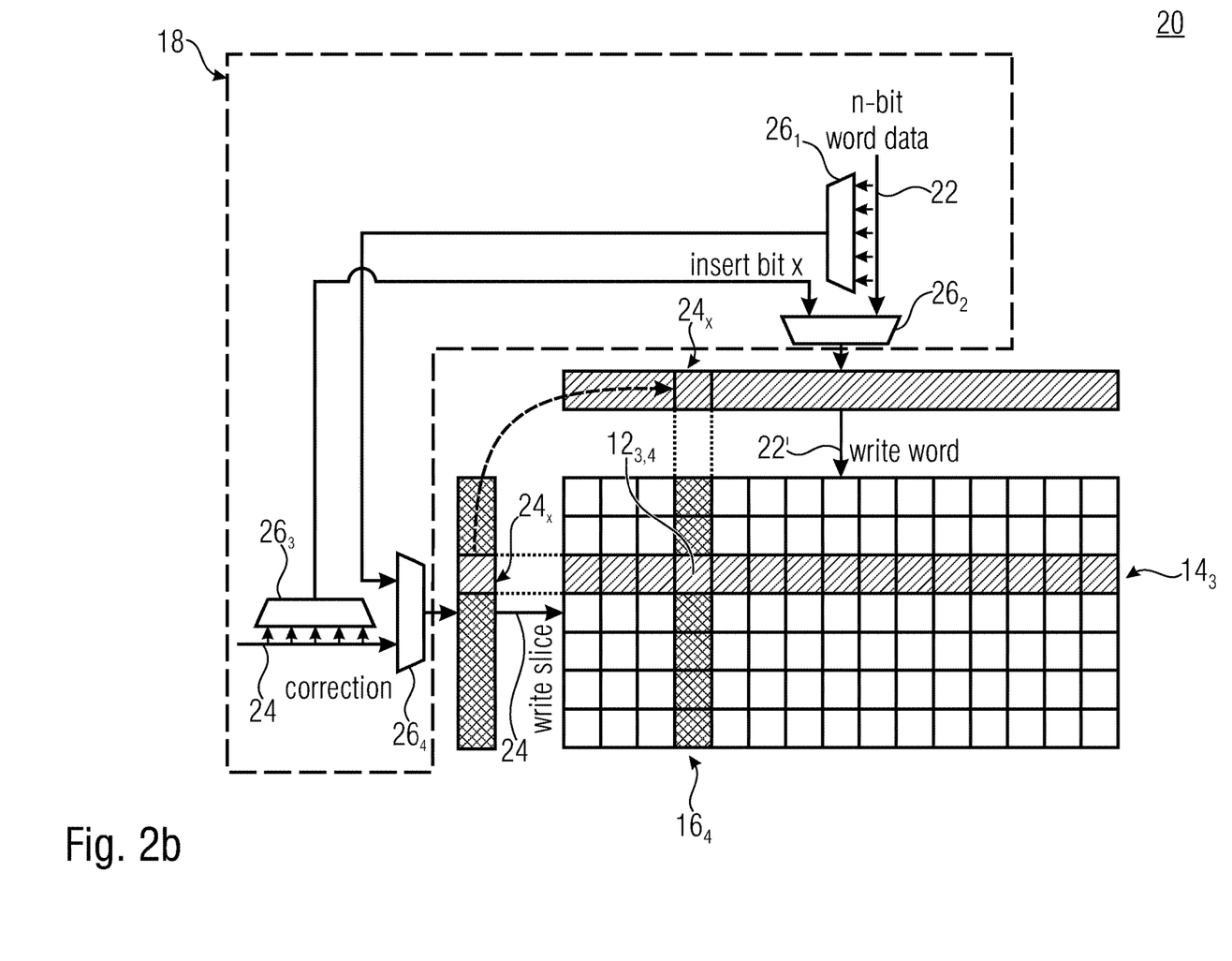
FIG. 2b shows a schematic block diagram of the data storage device and a configuration in which the slice information is prioritized over the word information according to an embodiment.

FIG. 2b shows a schematic block diagram of the data storage device 20 and a configuration in which the slice information 24 is prioritized over the word information 22. A bit x of slice information 24 may be inserted into the word information 22 to obtain modified word information 22'.

In FIG. 2b, different to FIG. 2a, the slice information has priority over the word information and the word information is a dummy information whilst the slice information is a real information (e.g., the slice information may be prioritized over the word information based on the slice information being the real information and/or the word information being the dummy information).

In some embodiments described herein, data from different data paths, i.e., word information and slice information, is written parallelly. This may lead to asymmetric information to be written orthogonal to the memory. For example, different bit sizes of data words and data slices may be present. This may lead to a large number of conflicts, e.g., almost every write may lead to a conflict. Embodiments provide for a solution which allows to write both data elements in one cycle, i.e., parallelly. For example, two elements, i.e., the word information and the slice information, are written to the memory, wherein one data element (e.g., the word information or the slice information) has priority. For an overlapping bit, the prioritized bit is selected, which may be a different single bit for a different combination of word/slice. Some and/or all bits of both data elements may be written to the memory, wherein, at a position of the overlapping bit (e.g., the common storage element), the same data may be written to this element (e.g., the common storage element) for both the word and the slice. This solution also works for multiple bits, e.g., if pipelining stages are used. For example, when referring to FIG. 2a and/or FIG. 2b, multiple bits may be copied from one data element to another.

Both configurations of data storage device 20 in FIG. 2a and FIG. 2b allow to reduce the number of write operations into the common data storage element $12_{3,4}$ to a single write operation. The configuration, in which information is prioritized over other information, may be fixed but may also be variable. For example, it may vary in view of a reliability or usability of information to be written. For example, several iterations are executed by the control unit 18 to write information into the word set $14_3$ and the slice set $16_4$. During one or more of those iterations, dummy information may form the slice information 24 or the word information 22. For example, one information, the word information 22 or the slice information 24, may be a real information to be protected by use of dummy operations and the other information thereof may comprise such a dummy information. In such a case, the real information may be prioritized over the dummy information.

Such a real information may be considered as a secret information which is written together with dummy information so as to hide writing operation of the secret information (e.g., to secure the secret information). For example, the control unit 18 may be configured for parallelly writing a secret information to a word set and a dummy information to a slice set associated with the word set, e.g., in the configuration of FIG. 2a. Alternatively, the control unit may parallelly write a dummy information to the word set and a secret information to the slice set as shown in the configuration of FIG. 2b.

For example, the control unit 18 may parallelly write a first secret information to the word set $14_3$ and a first dummy information to the slice set $16_4$ during a first iteration. During a second iteration, the control unit 18 may parallelly write a second dummy information to the word set $14_3$ and a second secret information to the slice set $16_4$. Between the iterations, the configuration between FIGS. 2a and 2b may be changed, e.g., using a control signal of the control unit 18.

For example, when denoting the real, secret word information 22 with a capital letter W and the real, secret slice information 24 with a capital letter S, whilst denoting a respective dummy information with corresponding small letters w, s respectively, and by indicating a cycle/iteration separator by a "-", and by separating rounds with the use of brackets (e.g., a round is within a set of brackets "[ ]"), and by indicating a hiding parameter (#dummy rounds/cycles) and when calculating costs compared with one round by parameter c, a computation only on words may be performed, in one example, with w-w-w-w-W-W-W-W.

Extending this example, to writing words and slices as implemented in some embodiments, a single round of such operations without hiding may be expressed with

W-W-W-W-S-S-S-S.

Hiding, i.e., a use of dummy information to hide a use of the real information, at the round level may be performed in known concepts, for example, by performing

[w-w-w-w-s-s-s-s]-[w-w-w-w-s-s-s-s]-[W-W-W-W-S-S-S-S]-[w-w-w-w-s-s-s-s]-[w-w-w-w-s-s-s-s]

[w-w-w-w-s-s-s-s] and [W-W-W-W-S-S-S-S] each denoting a round or iteration and may be used to store 4 times a word information and 4 times a slice information into the data storage device. The writing may be performed on different word sets and slice sets so as to avoid overwriting the real information with dummy information. Using a last write operation to write the real information may be a vulnerable concept in case an attacker gets knowledge about such a structure.

The example given provides for 5 rounds instead of one by using 4 dummy rounds and, thus, for 5 times the costs compared with one round, i.e., c=5.

A further example may be expressed as:

[w-w-w-w-s-s-s-s]-[w-w-w-w-s-s-s-s]-[w-w-w-w-s-s-s-s]-
[w-w-w-w-s-s-s-s]-[w-w-w-w-s-s-s-s]-[w-w-w-w-s-s-s-s]-
[W-W-W-W-S-S-S-S]-[w-w-w-w-s-s-s-s]-[w-w-w-w-s-s-s-s]

having 8 dummy rounds and one real iteration and, thus 9 times the cost compared with one round.

According to some embodiments, words and slices may be interleaved, e.g., according to:

[w-s]-[w-s]-[w-s]-[w-s]-[W-s]-[W-s]-[W-s]-[W-s]-[w-S]-[w-S]-[w-S]-[w-S]

Such a concepts mixes, within one round and for one or more rounds, a writing of dummy information and of real information, e.g., when writing [W-s] or [w-S]. In the example given, 12 rounds are provided having 4 dummy rounds and arriving at 3 times the costs when compared to writing words and slices without hiding.

In another example, the rounds may organized as follows:

[w-s]-[w-s]-[w-s]-[w-s]-[w-s]-[w-s]-[w-s]-[w-s]-[W-s]-[W-s]-[W-s]-[W-s]-[w-S]-[w-S]-[w-S]-[w-S]

Having 8 dummy rounds and 4 times the costs when compared to writing words and slices without hiding when writing 16 words and 16 slices.

As may be seen from the operations [W-s] and [w-S], one cycle may be performed by writing dummy information as well as real information or by writing dummy information only. When writing dummy information only in a cycle, indicated as [w-s], prioritizing may be performed in any direction and/or may be omitted.

According to some embodiments, the writing is performed such that the word and the slice is computed in the same cycle, e.g., according to

[ws]-[ws]-[ws]-[ws]-[Ws]-[Ws]-[Ws]-[Ws]-[wS]-[wS]-[wS]-[wS]

with 4 dummy rounds but only 1.5 times the costs when compared to a scenario without hiding or

[ws]-[ws]-[ws]-[ws]-[Ws]-[Ws]-[Ws]-[Ws]-[wS]-[wS]-[wS]-[wS]-[ws]-[ws]-[ws]-[ws]

having 8 dummy rounds but only 2 times the cost when compared to a scenario without hiding.

In the embodiments given, the cycle operator "-" may be located outside the iterations as, within an iteration the word information and the slice information are written parallelly.

This may be implemented together with a solution, by hardware and/or software to fix overlapping bits, e.g., by writing the prioritized bit last (e.g., writing the prioritized bit of the overlapping bits after one or more other bits of the overlapping bits are written) or by substituting pieces of information. This may be used to solve one or more issues in a scenario in which both the word and the slice need to be written in the same cycle and the overlapping bit (e.g., data storage element $12_{3,4}$) in the word (e.g., a row) and the slice (e.g., a column) might mismatch.

Embodiments provide for a special memory which implements a read or write or both together for simultaneously accessing orthogonal words and slices. This may be performed in a way so that it becomes impossible for an attacker to distinguish whether a word or slice was accessed. According to one aspect, a word and an associated slice are written together (e.g., a word and an associated slice are always written together). This enables hiding, at a cycle level, whether slices or words are processed, thereby deterring attacks on a cycle level (instead of deterring attacks on a round level, for example). An overlapping bit may be corrected at a changing bit position (x, y) for slice x and word y. This allows for protecting implementations of cryptographical algorithms, e.g., algorithms that use a mixing of orthogonal data.

Figure 3:
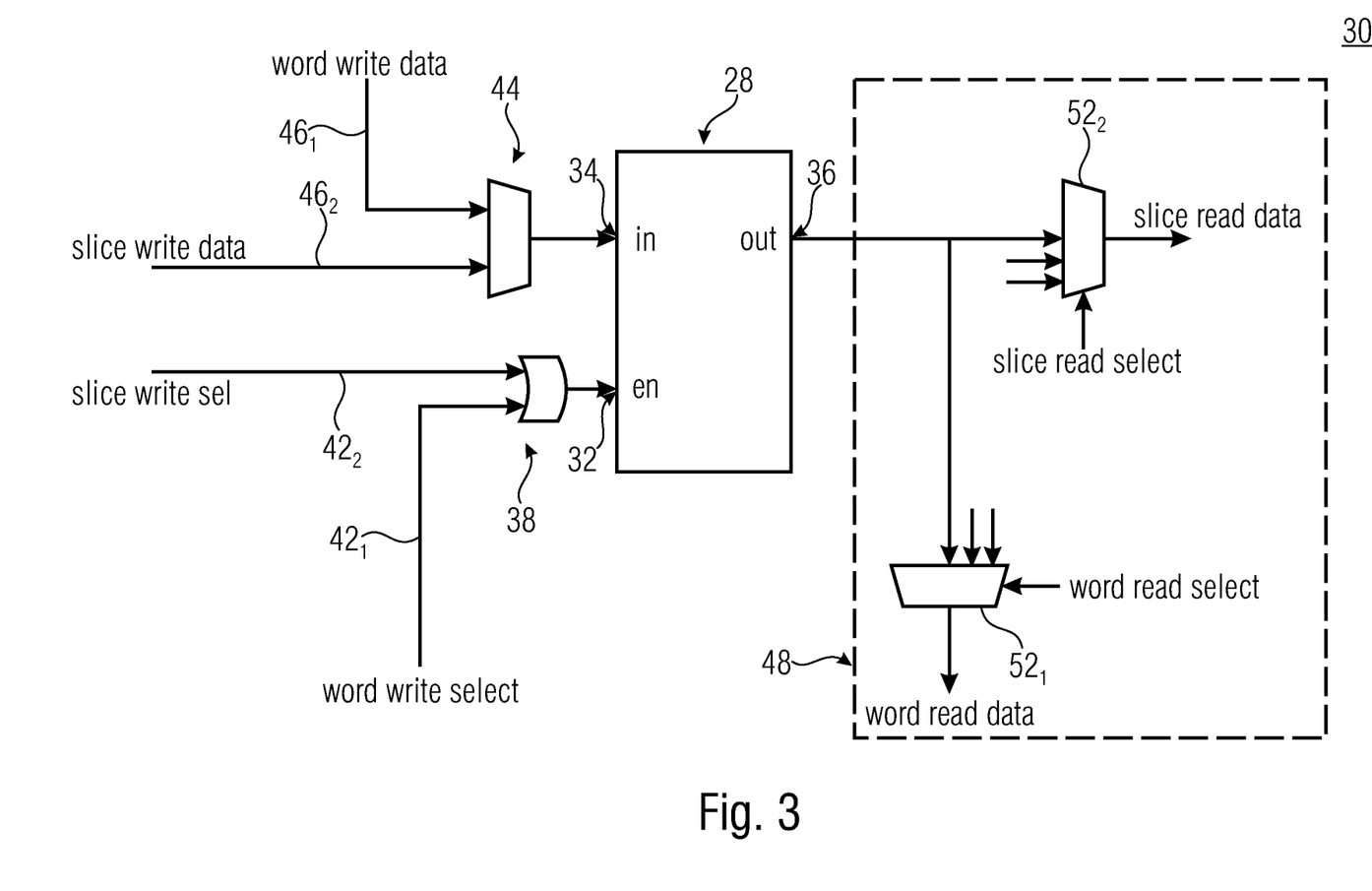
FIG. 3 shows a schematic block diagram of circuitry according to an embodiment, comprising a data storage element to allow writing the data storage element with word information or slice information.

FIG. 3 shows a schematic block diagram of circuitry 30 comprising a data storage element 28 to allow writing the data storage element 28 with word information 22 or slice information 24. For example, the illustrated circuitry 30 may be implemented for each data storage element of a memory field. The data storage element 28 may be, for example, a data storage element 12 of FIG. 1, FIG. 2a and/or FIG. 2b. That is, one or more of the data storage elements 12 may be formed as a data storage element 28. The information input 34 may be adapted to receive information to be written, e.g., a piece of information relating to a word information or a slice information. The control input 32 may be adapted for receiving a control signal, e.g., an enable signal or the like. The control input 32 may be connected to a control circuit 38 which may comprise, for example, an OR-gate or the like.

It will be understood that a similar behavior, when compared to the one being described in the following, may be obtained with different gates and/or a different circuitry. For example, the control circuit 38 may comprise an NOR gate as an alternative or in addition to the shown OR-gate.

The control circuit 38 may be configured for receiving a control signal $42_1$ indicating to write word information, e.g., word information 22. Further, the control circuit 38 may be configured for receiving a control signal $42_2$ indicating to write slice information, e.g., slice information 24. The control circuit 38 may be configured for enabling a write operation responsive to the control signal $42_1$ and/or the control signal $42_2$.

The data storage element 28 may comprise a control input 32, an information input 34 and an information output 36. The data storage element 28 may comprise a single data cell but may also comprise a plurality of data cells, e.g., to store multiple bits.

Alternatively or in addition, the information input 34 may be connected to a selection circuit 44 which may comprise, for example, a multiplexing element. The selection circuit 44 may be configured for receiving an information signal $46_1$ comprising at least a part of the word information 22 and for receiving an information signal $46_2$ comprising at least a part of the slice information 24. The selection circuit 44 may be configured for selecting one information signal, of the information signal $46_1$ and the information signal $46_2$, to be forwarded towards the data storage element 28 (e.g., the selected information signal may be output to the information input 34 of the data storage element 28).

The information output 36 may be connected to circuitry 48 being configured for providing the stored information. The information output 38 may be connected to one or more multiplexes $52_1$ and/or $52_2$ that may be connected to further data storage elements 28 of a same slice and/or a same word such that the data storage element 28 may be read when reading the word set or the slice set to which the data storage element 28 belongs.

Figure 4:
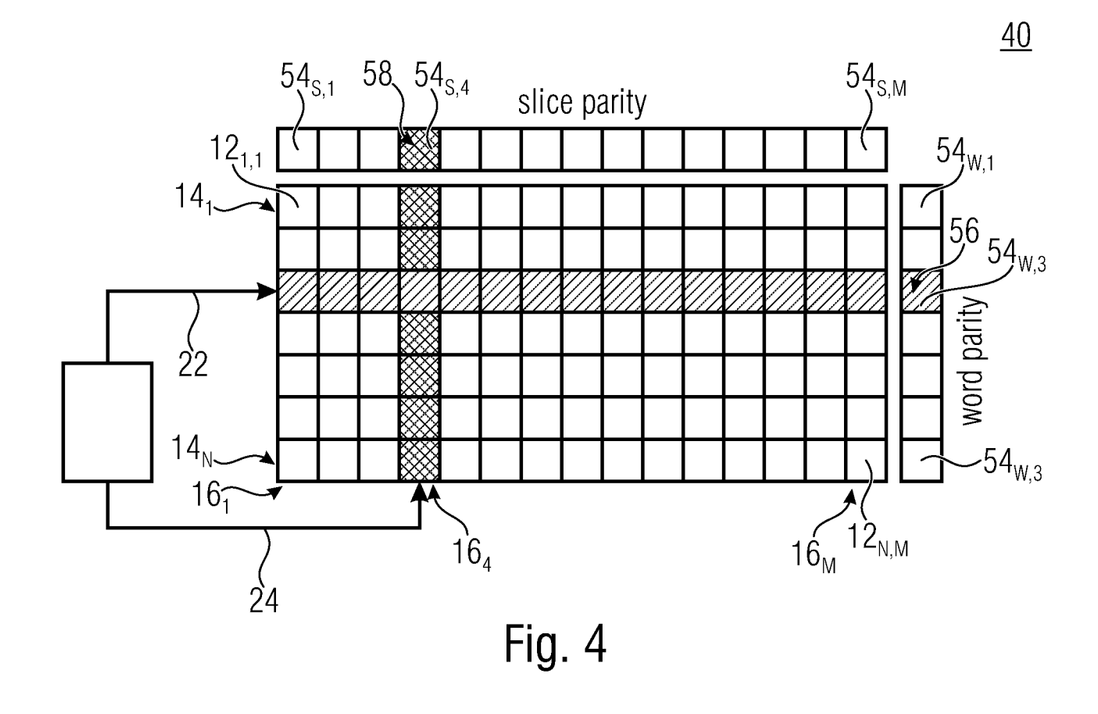
FIG. 4 shows a schematic block diagram of a data storage device according to an embodiment, the data storage device comprising additional data storage elements for storing parity information.

FIG. 4 shows a schematic block diagram of a data storage device 40 according to an embodiment. When compared to the data storage device 10 and/or 20, the data storage device 40 may comprise additional data storage elements 54 configured for storing parity information. Whilst the structure and/or function of the data storage element itself may be the same when compared to the data storage element 12 and/or 28, circuitry connected to the data storage element 54 may be more simple when compared to circuitry connected to the data storage element 28. For example, the data storage elements 54 may be considered as being not part of a word and a slice but, for example, as enlarging a word, a slice respectively.

The control unit 18 may be configured for parallelly writing the word information 22 and an associated word parity information 56 (e.g., the word parity information 56 is associated with the word information 22). The word parity information 56 may be stored, for example, into a data storage element $54_{w,3}$. The word set may overlap with a plurality of overlapping slice sets, e.g., some and/or all of the slice sets $16_1$ to $16_M$. By writing the word information, some and/or all of the information being contained in the slices $16_1$ to $16_M$ may be changed or altered. Parity information for at least one, some and/or all of those overlapping slice sets $16_1$ to $16_M$ may be updated in connection with writing the word information 22. Alternatively or in addition, the control unit 18 may write the slice information 24 into the slice set $16_4$, thereby also altering each of the word sets $14_1$ to $14_N$. The control unit may update a word parity information for one, some and/or for all overlapping word sets and may also write a slice parity information 58 into a corresponding data storage element $54_{5,4}$. Check that the second part is directed to write the slice information. Although the word parity information 56 and the slice parity information 58 is described so as to be written into a single data storage element 54, parity information may also be stored in a plurality of data storage elements, e.g., when comprising more than a single bit.

The parity information may allow for detection and/or correction of errors, e.g., using error detection codes (EDC) and/or error correcting codes (ECC). This may allow for enhancing data stored in the data storage device 40 using the parity information even after having changed the word information or the slice information in the common data storage element of a word set and a slice set. For example, an extension of the memory may be used to add an error detection code to words and slices using one or more parity bits for each word and one or more parity bits for each slice. The parity bit can be written and updated together with the word/slice write operation. This may allow for an error detection of the stored data similar to an EDC with a minimum distance of three, i.e., any three errors in the memory itself can be detected.

The control unit 18 in accordance with embodiments may be configured for obtaining the word information 22 based on one or more first bit transformations and for obtaining the slice information 24 based on one or more second bit transformations different than the one or more first bit transformations. For example, the data memory may be used in connection with Secure Hash Algorithm 3 (SHA-3) transformations. For example, on words, a RHO-transformation may be used. On a bit slice, a THETA transformation, a Pi-transformation, a CHI-transformation and/or an IOTA-transformation may be used.

For example, in accordance with an embodiment, a control unit may read one or more words from a corresponding number of word sets and may compute the RHO-transformation and may write the obtained word information (e.g., the word information may be obtained by performing the RHO-transformation on the one or more words). In parallel, the control unit may read one or more slices and compute the THETA-transformation, the PI-transformation, the CHI-transformation and/or the IOTA-transformation and may write the slice information 24 (e.g., the slice information 24 may be obtained by performing the THETA-transformation, the PI-transformation, the CHI-transformation and/or the IOTA-transformation on the one or more slices). For example, for using the RHO-transformation, 25 words of an example length of 64 bits may be read and/or written. A corresponding number of 64 25-bit slices may be read and/or written.

Embodiments provide for a memory with simultaneous orthogonal read and write access.

Figure 5:
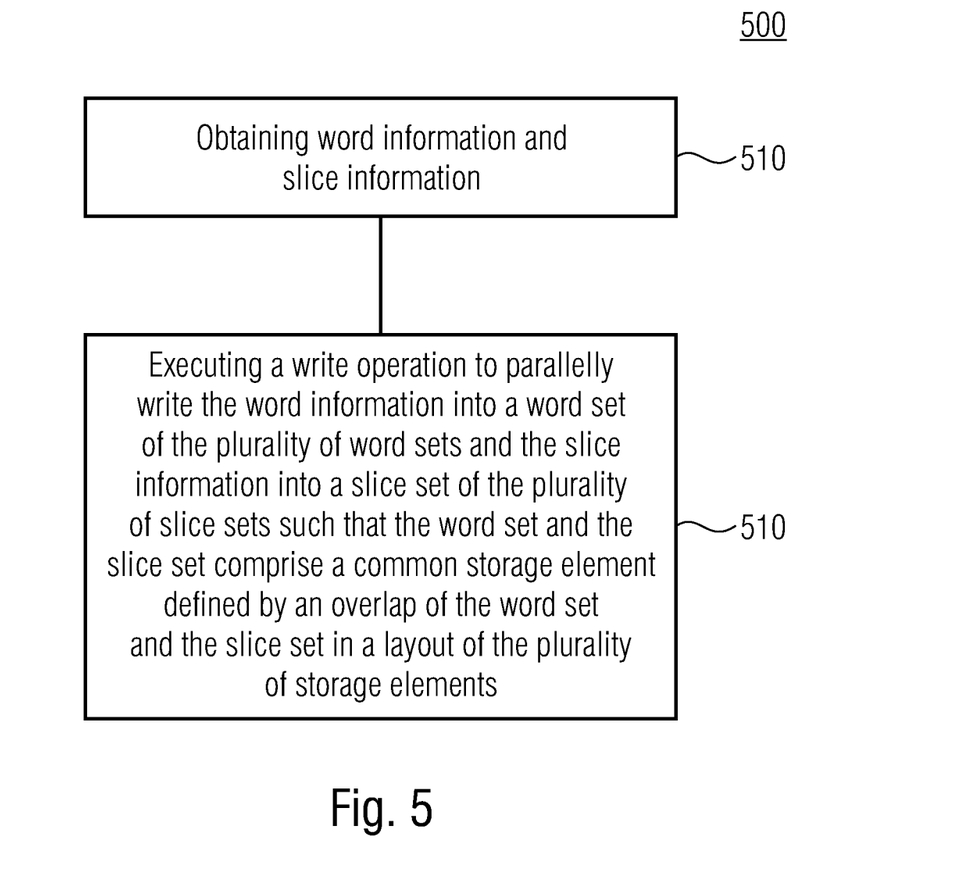
FIG. 5 shows a schematic flow chart of a method according to an embodiment.

FIG. 5 shows a schematic flow chart of a method 500 according to an embodiment. Method 500 may be used for writing information into a data storage device, e.g., data storage device 10, 20 and/or 40. The data storage device in connection with method 500 comprises a plurality of storage elements, each storage element configured for storing a piece of information. The plurality of storage elements are accessible as a plurality of word sets, each word set comprising a set of storage elements. Further, the plurality of storage elements are accessible as a plurality of slice sets, each slice set comprising a set of storage elements. Each storage element is a part of a word set and a part of a slice set. In 510, word information and slice information are obtained. In 520, a write operation is executed to parallelly write the word information into a word set of the plurality of word sets and the slice information into a slice set of the plurality of slice sets. In some examples, the word set and the slice set comprise a common storage element defined by an overlap of the word set and the slice set in a layout of the plurality of storage elements. For example, the write operation may be executed such that the word set and the slice set comprise the common storage element defined by the overlap of the word set and the slice set in the layout of the plurality of storage elements.

In the present disclosure, parallely writing first information (e.g., word information) and second information (e.g., slice information) comprises: (i) writing the first information during a first time interval and writing the second information during a second time interval, wherein the first time interval at least partially overlaps with the second time interval; and/or (ii) writing the first information and the second information in a same iteration, a same cycle and/or a same round.

Although some aspects have been described in the context of an apparatus, it is clear that these aspects also represent a description of the corresponding method, where a block or device corresponds to a method act or a feature of a method act. Analogously, aspects described in the context of a method act also represent a description of a corresponding block or item or feature of a corresponding apparatus.

Depending on certain implementation requirements, embodiments of the present disclosure can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the present disclosure comprise a data carrier having electronically readable control signals, which are capable of cooperating with a programmable computer system, such that one of the methods described herein is performed.

Generally, embodiments of the present disclosure can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, a security processor, a security module, a smartcard, a Trusted platform module (TPM), a secure root of trust or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A method for writing information into a data storage device comprising a plurality of storage elements, each storage element of the plurality of storage elements configured for storing a piece of information, wherein the plurality of storage elements are accessible as a plurality of word sets and as a plurality of slice sets, each word set of the plurality of word sets comprising a set of storage elements, and each slice set of the plurality of slice sets comprising a set of storage elements, and wherein each storage element of the plurality of storage elements is a part of a word set of the plurality of word sets and a part of a slice set of the plurality of slice sets, the method comprising:
 obtaining word information and slice information;
 executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements; and
 one of:
  parallelly writing a secret information to the first word set and a dummy information to the first slice set associated with the first word set; or
  parallelly writing a dummy information to the first word set and a secret information to the first slice set associated with the first word set.

2. The method of claim 1, wherein:
 the word information is written, into the plurality of storage elements according to a matrix configuration, along a first direction; and
 the slice information is written, into the plurality of storage elements according to the matrix configuration, along an orthogonal second direction.

3. The method of claim 1, comprising:
 solving a competing piece of information between the word information and the slice information for the common storage element.

4. The method of claim 1, comprising:
 writing a single data element to the common storage element to store either a part of the word information or a part of the slice information in the common storage element.

5. The method of claim 1, comprising, for the write operation:
 substituting a part, of the slice information, that corresponds to the common storage element with a corresponding part of the word information, the corresponding part of the word information corresponding to the common storage element; or substituting a part, of the word information, that corresponds to the common storage element with a corresponding part of the slice information, the corresponding part of the slice information corresponding to the common storage element.

6. The method of claim 1, comprising:
prioritizing the word information over the slice information in at least the common storage element; or
prioritizing the slice information over the word information in at least the common storage element.

7. The method of claim 1, wherein a storage element of the plurality of storage elements comprises an information input to receive information to be written, a control input for receiving a control signal and an information output, the method comprising:
receiving, with a selection circuit connected to the information input, a first information signal comprising at least a part of the word information;
receiving, with the selection circuit, a second information signal comprising at least a part of the slice information; and
selecting one information signal, of the first information signal and the second information signal, to be forwarded.

8. The method of claim 1, wherein at least one of:
the method comprises:
writing the word information into the first word set, the first word set overlapping with a plurality of overlapping slice sets;
updating a slice parity information for an overlapping slice set of the plurality of overlapping slice sets; and
writing a word parity information associated with the word information; and
the method comprises:
writing the slice information into the first slice set, the first slice set overlapping with a plurality of overlapping word sets;
updating a word parity information for an overlapping word set of the plurality of overlapping word sets; and
writing a slice parity information associated with the slice information.

9. The method of claim 1, wherein the word information is obtained based on one or more first bit transformations and the slice information is obtained based on one or more second bit transformations different than the one or more first bit transformations.

10. The method of claim 1, comprising:
during a first iteration, parallelly writing a first secret information to the first word set and a first dummy information to the first slice set associated with the first word set; and
during a second iteration, parallelly writing a second dummy information to the first word set and a second secret information to the first slice set associated with the first word set.

11. The method of claim 1, wherein:
the word information is written during a word-write time interval and the slice information is written during a slice-write time interval; and
the word-write time interval overlaps with the slice-write time interval for parallelly executing writing of the word information and writing of the slice information.

12. The method of claim 1, wherein:
the word information is obtained having a first data length and the slice information is obtained having a second data length different than the first data length.

13. A method for writing information into a data storage device comprising a plurality of storage elements, each storage element of the plurality of storage elements configured for storing a piece of information, wherein the plurality of storage elements are accessible as a plurality of word sets and as a plurality of slice sets, each word set of the plurality of word sets comprising a set of storage elements, and each slice set of the plurality of slice sets comprising a set of storage elements, and wherein each storage element of the plurality of storage elements is a part of a word set of the plurality of word sets and a part of a slice set of the plurality of slice sets, the method comprising:
obtaining word information and slice information;
executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements;
parallelly writing a plurality of word information into a corresponding plurality of word sets comprising the first word set and a plurality of slice information, associated with the plurality of word information, into a corresponding plurality of slice sets comprising the first slice set, each word set of the corresponding plurality of word sets comprising a common storage element with a slice set of the corresponding plurality of slice sets; and
solving a corresponding plurality of competing pieces of information at respective positions of common storage elements of the corresponding plurality of slice sets and the corresponding plurality of word sets.

14. A method for writing information into a data storage device comprising a plurality of storage elements, each storage element of the plurality of storage elements configured for storing a piece of information, wherein the plurality of storage elements are accessible as a plurality of word sets and as a plurality of slice sets, each word set of the plurality of word sets comprising a set of storage elements, and each slice set of the plurality of slice sets comprising a set of storage elements, and wherein each storage element of the plurality of storage elements is a part of a word set of the plurality of word sets and a part of a slice set of the plurality of slice sets, the method comprising:
obtaining word information and slice information;
executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements, wherein a storage element of the plurality of storage elements comprises an information input to receive information to be written, a control input for receiving a control signal and an information output;
receiving, with a control circuit connected to the control input, a first control signal indicating to write word information;
receiving, with the control circuit, a second control signal indicating to write slice information; and
enabling the write operation responsive to at least one of the first control signal and the second control signal.

15. A non-transitory storage medium having stored thereon a computer program having a program code for performing, when running on a computer, a method for writing information into a data storage device comprising a plurality of storage elements, each storage element of the plurality of storage elements configured for storing a piece of information, wherein the plurality of storage elements are accessible as a plurality of word sets and as a plurality of slice sets, each word set of the plurality of word sets comprising a set of storage elements, and each slice set of the plurality of slice sets comprising a set of storage elements, and wherein each storage element of the plurality of storage elements is a part of a word set of the plurality of word sets and a part of a slice set of the plurality of slice sets, the method comprising:

obtaining word information and slice information;

executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements; and     one of:

prioritizing the word information over the slice information in at least the common storage element; or         prioritizing the slice information over the word information in at least the common storage element.

16. The non-transitory storage medium of claim 15, wherein storage elements of the plurality of storage elements are connected to each other according to a matrix configuration in which word sets of the plurality of word sets are arranged parallel to each other along a first direction and in which slice sets of the plurality of slice sets are arranged parallel to each other along a second direction perpendicular to the first direction.

17. The non-transitory storage medium of claim 15, the method comprising:

solving a competing piece of information between the word information and the slice information for the common storage element.

18. A data storage device comprising:

a plurality of storage elements, each storage element of the plurality of storage elements configured for storing a piece of information, wherein:

the plurality of storage elements is:

accessible as a plurality of word sets, each word set of the plurality of word sets comprising a set of storage elements; and             accessible as a plurality of slice sets, each slice set of the plurality of slice sets comprising a set of storage elements; and         each storage element of the plurality of storage elements is a part of a word set of the plurality of word sets and a part of a slice set of the plurality of slice sets; and     a control unit configured for:

obtaining word information and slice information;

executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements; and         for the write operation:

substituting a part of the slice information, that corresponds to the common storage element, with a corresponding part of the word information, the corresponding part of the word information corresponding to the common storage element; or             substituting a part of the word information, that corresponds to the common storage element, with a corresponding part of the slice information, the corresponding part of the slice information corresponding to the common storage element.

19. The data storage device of claim 18, wherein storage elements of the plurality of storage elements are connected to each other according to a matrix configuration in which word sets of the plurality of word sets are arranged parallel to each other along a first direction and in which slice sets of the plurality of slice sets are arranged parallel to each other along a second direction perpendicular to the first direction.

20. The data storage device of claim 19, wherein the control unit is configured for writing, into the plurality of storage elements according to the matrix configuration, the word information along the first direction and the slice information along the second direction.

21. The data storage device of claim 18, wherein the control unit is configured for solving a competing piece of information between the word information and the slice information for the common storage element.

22. The data storage device of claim 18, wherein the control unit is configured for writing a single data element to the common storage element to store either a part of the word information or a part of the slice information in the common storage element.

23. The data storage device of claim 18, wherein the control unit is configured for:

prioritizing the word information over the slice information in at least the common storage element; or     prioritizing the slice information over the word information in at least the common storage element.

24. The data storage device of claim 18, wherein the control unit is configured for:

parallelly writing a plurality of word information into a corresponding plurality of word sets comprising the first word set and a plurality of slice information, associated with the plurality of word information, into a corresponding plurality of slice sets comprising the first slice set, each word set of the corresponding plurality of word sets comprising a common storage element with a slice set of the corresponding plurality of slice sets; and     solving a corresponding plurality of competing pieces of information at respective positions of common storage elements of the corresponding plurality of slice sets and the corresponding plurality of word sets.

25. The data storage device of claim 18, wherein a storage element of the plurality of storage elements comprises:

an information input to receive information to be written;

a control input for receiving a control signal; and an information output, wherein the control input is connected to a control circuit configured for:

receiving a first control signal indicating to write word information;

receiving a second control signal indicating to write slice information; and         enabling the write operation responsive to at least one of the first control signal and the second control signal.

26. The data storage device of claim 18, wherein the control unit is configured for obtaining the word information based on one or more first bit transformations and for obtaining the slice information based on one or more second bit transformations different than the one or more first bit transformations.

27. The data storage device of claim 18, wherein the control unit is configured for:
parallelly writing a secret information to the first word set and a dummy information to the first slice set associated with the first word set; or
parallelly writing a dummy information to the first word set and a secret information to the first slice set associated with the first word set.

28. The data storage device of claim 18, wherein the control unit is configured for:
during a first iteration, parallelly writing a first secret information to the first word set and a first dummy information to the first slice set associated with the first word set; and
during a second iteration, parallelly writing a second dummy information to the first word set and a second secret information to the first slice set associated with the first word set.

29. The data storage device of claim 18, wherein the control unit is configured for:
writing the word information during a word-write time interval and writing the slice information during a slice-write time interval; and
writing the word information and the slice information such that the word-write time interval overlaps with the slice-write time interval for parallelly executing writing of the word information and writing of the slice information.

30. The data storage device of claim 18, wherein the control unit is configured for obtaining the word information having a first data length and the slice information having a second data length different than the first data length.

31. A data storage device comprising:
a plurality of storage elements, each storage element of the plurality of storage elements configured for storing a piece of information, wherein:
the plurality of storage elements is:
accessible as a plurality of word sets, each word set of the plurality of word sets comprising a set of storage elements; and
accessible as a plurality of slice sets, each slice set of the plurality of slice sets comprising a set of storage elements;
each storage element of the plurality of storage elements is a part of a word set of the plurality of word sets and a part of a slice set of the plurality of slice sets; and
a control unit configured for obtaining word information and slice information and for executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements, wherein:

a storage element of the plurality of storage elements comprises:
an information input to receive information to be written;
a control input for receiving a control signal; and
an information output; and
the information input is connected to a selection circuit configured for:
receiving a first information signal comprising at least a part of the word information;
receiving a second information signal comprising at least a part of the slice information; and
selecting one information signal, of the first information signal and the second information signal, to be forwarded.

32. A data storage device comprising:
a plurality of storage elements, each storage element of the plurality of storage elements configured for storing a piece of information, wherein:
the plurality of storage elements is:
accessible as a plurality of word sets, each word set of the plurality of word sets comprising a set of storage elements; and
accessible as a plurality of slice sets, each slice set of the plurality of slice sets comprising a set of storage elements; and
each storage element of the plurality of storage elements is a part of a word set of the plurality of word sets and a part of a slice set of the plurality of slice sets; and
a control unit configured for obtaining word information and slice information and for executing a write operation to parallelly write the word information into a first word set of the plurality of word sets and the slice information into a first slice set of the plurality of slice sets, wherein the first word set and the first slice set comprise a common storage element defined by an overlap of the first word set and the first slice set in a layout of the plurality of storage elements,
wherein at least one of:
the control unit is configured for:
writing the word information into the first word set, the first word set overlapping with a plurality of overlapping slice sets;
updating a slice parity information for an overlapping slice set of the plurality of overlapping slice sets; and
writing a word parity information associated with the word information; and
the control unit is configured for:
writing the slice information into the first slice set, the first slice set overlapping with a plurality of overlapping word sets;
updating a word parity information for an overlapping word set of the plurality of overlapping word sets; and
writing a slice parity information associated with the slice information.

* * * * *